United States Patent [19]
Sasaki et al.

[11] Patent Number: 5,096,559
[45] Date of Patent: Mar. 17, 1992

[54] CATHODE ROLLER MECHANISM

[75] Inventors: Ikuo Sasaki; Shoji Murakami; Koji Abe; Kenichi Onishi, all of Saijo, Japan

[73] Assignee: Mitsubishi Denki Kabushiki Kaisha, Japan

[21] Appl. No.: 548,572

[22] Filed: Jul. 5, 1990

[30] Foreign Application Priority Data

Jul. 12, 1989 [JP] Japan .................. 1-178166

[51] Int. Cl.$^5$ ............................................. C25D 17/00
[52] U.S. Cl. .................................. 204/198; 204/286; 204/288; 437/212; 437/220; 29/724; 29/110; 118/620
[58] Field of Search ............... 204/200, 286, 288, 289, 204/198, 212, 196; 437/211, 212, 220; 29/424, 110; 118/620, DIG. 15

[56] References Cited
FOREIGN PATENT DOCUMENTS
63-24273 2/1988 Japan .

Primary Examiner—John Niebling
Assistant Examiner—Kathryn Gorgos
Attorney, Agent, or Firm—Leydig, Voit & Mayer

[57] ABSTRACT

A cathode roller mechanism comprises a tapered cathode roller for establishing an electrical connection to a semiconductor lead frame and an elastic, frictional pressure roller. The cathode roller comprises a tapered roller body defining a tapered side surface and an electrically conductive stopper disposed on the roller body and having an inner tapered electrode. The pressure roller is arranged so that the path of a drifted lead frame can be corrected, and the drift of the lead frame can be positively prevented by pressing the lead frame in such a manner that no drift of the lead frame occurs. In addition, an auxiliary electrode is provided on the inside of the tapered electrode, a third tapered surface is provided on the auxiliary electrode, and the width of the pressure roller is set to a length sufficient to press a corner of a molded portion of lead frame having the maximum width so that electrical continuity, i.e., the connection between the lead frame and the electrode, can be stabilized, and the lead frame can be more stably made a cathode.

5 Claims, 2 Drawing Sheets

CATHODE ROLLER MECHANISM

BACKGROUND OF THE INVENTION

1. Field of the Invention

The present invention relates to an apparatus for producing a semiconductor device, and particularly to a cathode roller mechanism provided in an electrolytic apparatus for electrolyzing the lead frame of a semiconductor device.

2. Description of the Related Art

The surfaces of the external leads of insulating sealed semiconductor packages are generally plated by solder electroplating for the purpose of imparting corrosive resistance to the external leads and sufficiently soldering them. Electrolysis is effected in the above solder electroplating process and pretreatment processes such as electrolytic degreasing and deburring processes. A cathode roller mechanism is provided in an electrolytic cell which is filled with an electrolyte used for electrolyzing a semiconductor device. The cathode roller mechanism carries the semiconductor device in the electrolyte while the lead frame of the semiconductor device is being electrically connected to an external circuit to be made a cathode under electrical continuity by the cathode roller mechanism.

FIG. 1 is a schematic side view of a conventional cathode roller mechanism disclosed, for example, in Japanese Utility Model Laid-Open No. 63-24273. In a cathode roller mechanism 10, a lead frame 40, which is integrated with a molded portion 41 is carried in an electrolyte (not shown) by the rotation of a cathode roller 20 and a pressure roller 30 while being held between these rollers 20 and 30, and the lead frame 40 is made a cathode under electrical continuity by the cathode roller 20. The cathode roller 20 comprises a cathode roller shaft 21, a tapered roller body 23 and an electrically conductive stopper 26. The cathode roller shaft 21 is a shaft which is made of an electrically conductive material so that it can conduct the electricity. The cathode roller shaft 21 has the function to rotate the portion including the tapered roller body 23 and the electrically conductive stopper 26 and makes the lead frame 40 a cathode through the electrically conductive stopper 26 during electrical conduction of a cathode current. The tapered roller body 23 has a tapered surface 22, which also serves as a mounting surface for the lead frame 40, between a small diameter portion 24 and a large diameter portion 25. The tapered roller body 23 is formed of an insulating material. The electrically conductive stopper 26 has a diameter which is larger than the diameter of the small diameter portion 24 of the tapered roller body 23 and is made of a electrically conductive material. The electrically conductive stopper 26 is provided at the small diameter portion 24 side of the tapered roller body 23 so that one end of the lead frame 40 contacts with the stopper 26. The stopper 26 is also electrically connected to the cathode roller shaft 21. The pressure roller 30 comprises a roller shaft 31 and a roller body 32. The roller body 32 is made of a sponge so as to have elasticity and has the function to press the lead frame 40 on the tapered surface 22 of the cathode roller 20 so as to cause the lead frame 40 to be easily carried in the horizontal direction. In practice, many cathode roller mechanisms 10 are provided in such a manner that they are arranged in the direction of conveyance of the lead frame 40 (not shown). The lead frame 40 is thus successively transferred in the horizontal direction while being made a cathode.

A brief description will now be given of the operation.

Since the tapered roller body 23 of the cathode roller 20 has the tapered surface 22, the lead frame 40 is moved along the tapered surface 22 in the direction shown by the arrow R in FIG. 1 and is made a cathode owing to the contact between the conductive stopper 26 and one edge of the lead frame 40. The lead frame 40 is also elastically pressed on the tapered surface 22 by the roller body 32 of the pressure roller 30. This stabilizes the connection between the edge of the lead frame 40 and the conductive stopper 26. The cathode roller mechanism 10, therefore, carries the lead frame 40 while making it a cathode.

However, the conventional cathode roller mechanism configured as described above has a problem in that no positive measure is taken to prevent a deviation of the lead frame from the cathode roller mechanism during the conveyance, and particularly a deviation of the lead frame from a predetermined position when it enters the cathode roller mechanism.

SUMMARY OF THE INVENTION

The present invention has been achieved with a view to solving the above-described problem, and it is an object of the present invention to provide a cathode roller mechanism which is provided with a positive measure to prevent a deviation of a lead frame so as to return it to a normal position even if there is some deviation and which further stabilizes the connection between the lead frame and the electrode of a cathode roller.

Considering the above object, the present invention provides a cathode roller mechanism including a cathode roller for conveying the lead frame of a semiconductor device while making the frame a cathode in an electrolyte. The cathode roller comprises a tapered roller body which is made of an electrically insulating material, which has a tapered side surface between a small diameter portion and a large diameter portion for the purpose of moving a lead frame toward the small diameter portion and mounting the lead frame thereon, and which has a flange-like stopper portion which is formed on the side of the large diameter portion and has on the inside of the stopper portion a first tapered surface for moving the lead frame in the direction of the side surface. The cathode roller also comprises a tapered electrically conductive stopper which has a diameter larger than that of the small diameter portion, which is formed on the small diameter portion of the roller body and which has on the inside thereof a tapered electrode having a second tapered surface with which the edge of the lead frame contacts and which is tapered in the direction opposite to the direction of the inclination of the side surface of the tapered roller body so as to move the lead frame toward the small diameter portion of the roller body. The cathode roller further comprises a cathode roller shaft which is electrically connected to the tapered electrode, which has a portion being in contact with the electrolyte and covered with a collar made of an insulating material and whose shaft is made of a conductive material and serves as a rotational shaft for the tapered roller body and the tapered electrically conductive stopper. The cathode roller mechanism also comprises a pressure roller comprising an elastic roller body for pressing the lead frame on the side of the tapered roller body and a pressure roller shaft which serves as a rotational shaft for the pressure roller body and which is made of an insulating material at least along a surface thereof.

In the present invention, the provision of the stopper portion on the tapered roller body, the first tapered surface on the inside of the stopper portion and the second tapered surface of the tapered electrode on the inside of the tapered electrically conductive stopper prevents any deviation of the lead frame from occurring by correcting the position of the lead frame during conveyance and ensures an electrical connection to the lead frame so that it is made a cathode.

DESCRIPTION OF THE PREFERRED EMBODIMENTS

Figure 1:
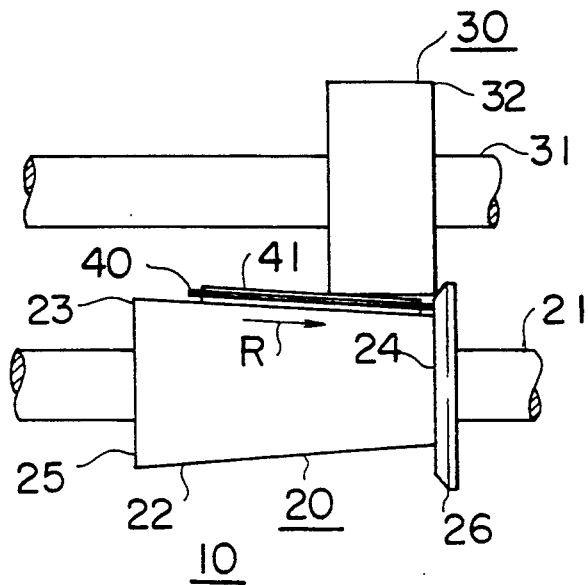
FIG. 1 is a side view of a conventional cathode roller mechanism.
Figure 2:
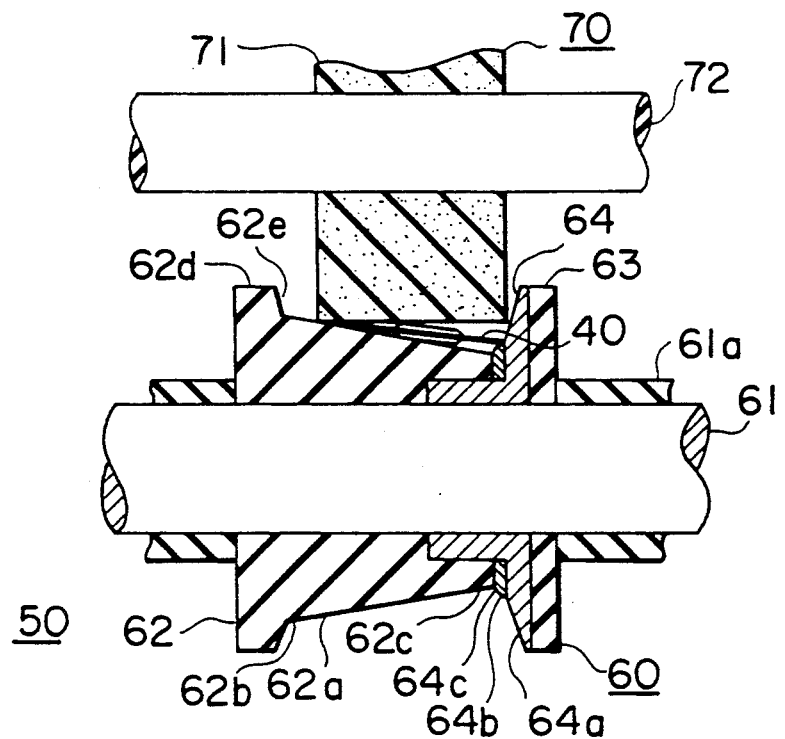
FIG. 2 is a sectional view of a cathode roller mechanism in an embodiment of the present invention.
Figure 2A:
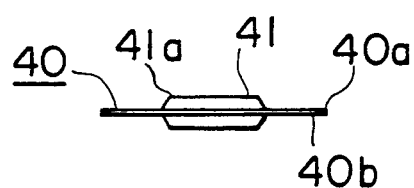
FIG. 2A is a side view of a lead frame including a molded portion.

An embodiment of the present invention is described below with reference to the drawings. FIG. 2 is a sectional view of a cathode roller mechanism of an embodiment of the present invention, and FIG. 2A is a side view of a lead frame. The cathode roller mechanism 50 shown in FIG. 2 comprises a cathode roller 60 and a pressure roller 70. The roller portion of the cathode roller 60 comprises a tapered roller body 62 and a tapered electrically conductive stopper 63. The tapered roller body 62 is made of an insulating material and has a tapered side surface 62a for mounting a lead frame 40 thereon between a small diameter part 62c and a large diameter portion 62b. A flange-like stopper portion 62d is provided on the side of the side surface 62a near the large diameter portion 62b, and a first tapered surface 62e which is inclined in the same direction as that of the side surface 62a is formed on the inside of the stopper portion 62d. The tapered conductive stopper 63 is provided on the side of the tapered roller body 62 near the small diameter portion 62c so as to have a diameter larger than that of the small diameter portion 62c. A second tapered surface 64a, which is inclined in the direction opposite to the side surface 62a of the tapered roller body 62, is provided on the inside of the tapered conductive stopper 63 so that one side edge or an end 40a of the lead frame 40 contacts with the second tapered surface 64a (refer to FIG. 2A). A cathode roller shaft 61 serving as the rotational shaft for the roller portion is made of a conductive material and is electrically connected to a tapered electrode 64 of the stopper 63. The portion of the cathode roller shaft 61, which contacts with an electrolyte, is covered with a collar 61a made of an insulating material. A pressure roller 70 comprises a pressure roller body 71 having an elasticity for pressing the lead frame 40 on the side surface 62a of the tapered roller body 62 and a pressure roller shaft 72 serving as a rotational shaft for the pressure roller body 71 and is made of an insulating material at least along the surface thereof (in FIG. 2, the core portion is also made of an insulating material). The pressure roller body 71 is made of an elastic, frictional material such as sponge. An auxiliary electrode 64b having a third tapered surface 64c inclined in the same direction as that of the second tapered surface 64a may be provided on the inside of the small diameter portion of the tapered electrode 64 so that the side 40b at one edge of the lead frame 40 contacts with the large diameter portion of the third tapered surface 64c (refer to FIG. 2A).

Figure 3:
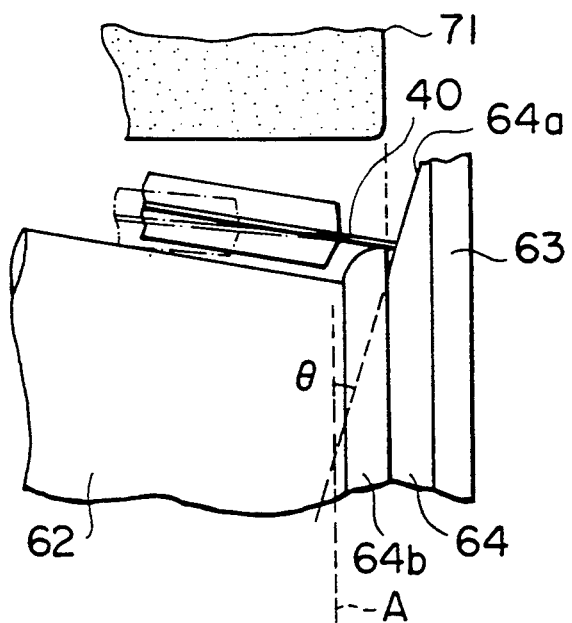
FIG. 3 is an enlarged broken view which shows the portion of connection between the electrode portion and the lead frame in the cathode roller mechanism shown in FIG. 2.

The taper angle of the first tapered surface 62e provided on the inside of the stopper portion 62d formed on the tapered roller body 62 and the taper angle of the second tapered surface 64a of the tapered electrode 64 provided on tapered surface 64a of the tapered electrode 64 provided on the inside of the tapered conductive stopper 63 are respectively selected so that, when the position of the lead frame 40 carried is deviated, the position of the lead frame 40 can be corrected to the original position, i.e., the bottom of the side surface 62a of the tapered roller body 62. For example, FIG. 3 shows the taper angle $\theta$ of the second tapered surface 64a of the tapered electrode 64 with respect to a plane A shown by a broken line and perpendicular to the axis of the roller body. If the taper angle $\theta$ is excessively small, the correction width is small, while if the taper angle $\theta$ is excessively large, there is no ability to correct the deviation. In an embodiment of a cathode roller mechanism, if the axial width of the cathode roller 60 is about 6 cm, the diameters of the stopper portion 62d of the tapered roller body 62 and the maximum diameters of the stopper 63 is about 7 cm, respectively, the diameter of the minimum diameter portion of the tapered roller body 62 is about 4.5 cm, and the gap between the inner end of the first tapered surface 62e of the stopper portion 62d and the inner end of the second tapered surface 64a of the tapered electrode 64 is about 4.3 cm; the taper angle $\theta$ of the second tapered surface 64a is preferably about 25°. On the other hand, the third tapered surface 64c of the auxiliary electrode 64b may be rounded so that the end portion 40a of the lead frame 40 smoothly contacts with the tapered surface 64a, the maximum diameter portion of the auxiliary electrode 64b contacts with the side 40b at one end of the lead frame 40, thereby more surely making the lead frame 40 a cathode. As a matter of course, the side surface 62a of the tapered roller body 62 has the function to move the lead frame 40 to the bottom, i.e., the small diameter portion 62c, of the side surface in the same way as conventional mechanisms.

Each of the tapered electrode 64 and the auxiliary electrode 64b is preferably a minimum size necessary for making the lead frame 40 a cathode in view of problems with respect to the electric power consumed by the electrolytic apparatus and the adhesion of the plating material used during plating.

The pressure roller body 71 is positioned so that one end thereof near the tapered electrode 64 is positioned above the end of the small diameter portion of the second tapered surface 64a, as shown in FIG. 3, while the pressure roller body 71 has such an axial width that the body can press the corner 41a of the molded portion 41 of the lead frame 40, which has the maximum width in the frames carried through the rollers, near the large diameter portion 62b of the tapered roller body 62 (refer to FIG. 2A). The pressure roller body 71 presses the corner 41a of the molded portion 41 so as to increase the force of pressing the end portion 40a of the lead frame 40 on the electrode portion. Since the width of the pressure roller is set to the maximum width of the lead frame 40 carried, the roller need not be changed when the type of lead frame is changed. However, conventional roller mechanisms have the need to change the roller when lead frames having different frame widths are passed trough the electrolytic apparatus (a problem with respect to flexibility in production of various kinds of frames in small amounts).

In the cathode roller mechanism 50 configured as described above, the path of the lead frame 40 drifted from the normal path can be corrected, and the lead frame 40 can be prevented from deviating by pressing the lead frame 40 by the following means:

(a) the tapered side surface 62a provided on the tapered roller body 62, (b) the stopper portion 62b formed on the tapered roller body 62 and the first tapered surface provided on the inside of the stopper 62b, (c) the second tapered surface 64a of the tapered electrode 64 provided on the inside of the tapered conductive stopper 63, and (d) the pressure roller body 71 of the pressure roller 70 which is made of a sponge and whose width and position are set in the above-described manner.

The cathode roller mechanism 50 also has the following advantages:

(e) Since the cathode roller mechanism has the auxiliary electrode 64b provided on the inside of the tapered electrode 64, the third tapered surface 64c formed on the auxiliary electrode 64b and the pressure roller body 71 whose width is set to a length sufficient to press the corner 41a of the molded portion 41 of the lead frame, which has the maximum width, the electrical continuity, i.e., the connection between the lead frame 40 and the electrode, can be stabilized, and the lead frame 40 can be surely made a cathode.

In addition, since the width of the roller body 71 is set to a sufficient value corresponding to the lead frame to be carried having the maximum width, the roller need not be changed even when the type of lead frame is changed.

Further, if a soluble solder plate is used as a cathode metal plate (not shown) in a case of electroplating, and if an insoluble metal is used as the metal cathode plate in a case of electrolytic degreasing or deburring, it is possible to prevent a deterioration of the electrolyte.

As described above, the path of the lead frame deniated can be corrected by the functions of the tapered side surface 62a, the first tapered surface 62e, the second tapered surface 64a and the pressure roller 70 whose width and position are set in the above-described manner. A deviation of the lead frame can be positively prevented by pressing it in such a manner that no drift of the lead frame occurs. In addition, the electrical continuity, i.e., the connection between the lead frame 40 and the electrode can be stabilized by the functions of the auxiliary electrode 64b provided on the inner side of the tapered electrode 64, of the third tapered surface 64c and of the pressure roller body 71 whose width is set to a length sufficient to press the corner 41a of the molded portion 41 of the lead frame 40, thereby further stably making the lead frame 40 a cathode. Further, since the width of the roller body 71 is set to a sufficient value corresponding to the maximum width of the lead frame to be carried, it is unnecessary to change the roller even when the type of lead frame is changed.

What is claimed is:

1. A cathode roller mechanism for carrying a semiconductor device which includes a lead frame integrated with a molded portion while making said lead frame a cathode in an electrolyte, said roller mechanism comprising:

a cathode roller including:

a) a tapered roller body being made of an insulating material, and having between a small diameter portion, a large diameter portion and a side surface defined therebetween, said side surface serving as a mounting surface for said lead frame and inclined for moving said lead frame to said small diameter portion and in which a flange-shaped stopper portion is formed on said large diameter portion to have on an inside thereof a first tapered surface for moving said lead frame toward said side surface in the same direction as that of said side surface;

b) a tapered electrically conductive stopper which is inclined for moving said lead frame toward said small diameter portion of said roller body in the direction opposite to the inclination of said side surface of said tapered roller body, which has in an inside thereof a tapered electrode having a second tapered surface to which one side edge of said lead frame contacts and which is formed on said small diameter portion of said roller body and has a diameter larger than that of said small diameter portion; and c) a cathode roller shaft which is electrically connected to said tapered electrode, which has a portion, that contacts with said electrolyte and is made of an insulating material, and said shaft is being made of an insulating material and serving as a rotational shaft for said tapered roller body and said tapered electrically conductive stopper; and and a pressure roller comprising a pressure roller body having elasticity for pressing said lead frame on said side surface of said tapered roller body and a pressure roller shaft serving as a rotational shaft for said pressure roller body and being made of an insulating material at least along a surface thereof.

2. A cathode roller mechanism according to claim 1, wherein said tapered electrically conductive stopper has an auxiliary electrode which is provided on a small diameter portion side of said tapered electrode and which has a third tapered surface inclined in a direction as that of said second tapered surface where a large diameter portion of said third tapered surface contacts with a side surface at the end of said lead frame when said lead frame is at a desired position.

3. A cathode roller mechanism for carrying a semiconductor device including a lead frame having a side edge and a bottom surface, said roller mechanism comprising:

a pressure roller shaft having a pressure roller rotatably mounted on said shaft; and a cathode roller shaft having a cathode roller rotatably mounted on said cathode roller shaft, said cathode roller including:

(a) an insulated tapered roller body having a small diameter portion, a large diameter portion and a side surface defined therebetween inside said small and large diameter portions, said side surface providing a lead frame mounting surface and being inclined for moving the lead frame toward said small diameter portion;

(b) a first stopper disposed on said large diameter portion, said first stopper having an inside first tapered surface facing said small diameter portion and being tapered in the same direction as the inclination of said side surface for moving the lead frame toward said small diameter portion;

(c) an electrically conductive second stopper disposed on said small diameter portion and having an inside surface facing said large diameter portion;

(d) a first electrode disposed on said small diameter portion adjacent and inside said second stopper inside surface, said first electrode having a diameter larger than that of said small diameter portion, and having an inside second tapered surface, said second tapered surface facing said large diameter portion and being tapered in a direction opposite to the inclination of said roller body side surface and being contacted by the side edge of the lead frame; and (e) an auxiliary electrode disposed on said small diameter portion adjacent and inside said inside second tapered surface of said first electrode, said auxiliary electrode having a smaller diameter than that of said first electrode and having an inside third tapered surface being tapered in the same direction as said second tapered surface and being contacted by the bottom surface of the lead frame.

4. A cathode mechanism according to claim 2, wherein said pressure roller body has a first end at a position above said inside second tapered surface of said first electrode; wherein the semiconductor device includes a molded portion integrated with the lead frame and having a corner adjacent said large diameter portion, and wherein said pressure roller body has a width sufficient to press the corner of the molded portion of the lead frame.

5. A cathode roller mechanism according to claim 3, wherein said cathode roller has an axial width of about 6 cm, the diameter of said first stopper and the maximum diameter of said electrically conductive second stopper are about 7 cm, respectively, the diameter of said small diameter portion of said tapered roller body is about 4.5 cm, a gap between said inner end of said first tapered surface of said first stopper and the inner end of said second tapered surface of said first electrode is about 4.3 cm, and a taper angle of said second tapered surface with respect to plane perpendicular to an axis of said cathode roller is about 25°.

* * * * *